United States Patent [19]
Gotoh

[11] Patent Number: 5,287,057
[45] Date of Patent: Feb. 15, 1994

[54] SUPERCONDUCTING CIRCUIT HAVING A RECTIFIER FOR CONVERTING A BIPOLAR SIGNAL TO A UNIPOLAR SIGNAL

[75] Inventor: Kohtaroh Gotoh, Kawasaki, Japan
[73] Assignee: Fujitsu Limited, Kawasaki, Japan
[21] Appl. No.: 850,918
[22] Filed: Mar. 13, 1992

[30] Foreign Application Priority Data

Mar. 19, 1991 [JP] Japan ................... 3-054270

[51] Int. Cl.$^5$ ............... G01R 33/035; G01R 19/22; H03K 3/38; H03K 17/92
[52] U.S. Cl. .................... 324/248; 307/245; 307/306; 307/277; 324/119; 328/26; 505/845; 505/861; 505/864
[58] Field of Search .......... 324/119, 248; 307/245, 307/261, 262, 277, 306; 505/845, 861, 864, 865

[56] References Cited

U.S. PATENT DOCUMENTS 4,710,651  12/1987  Suzuki ..................... 307/277 X

FOREIGN PATENT DOCUMENTS 3102777  4/1982  Fed. Rep. of Germany .
0210722  11/1984  Japan ..................... 307/277
2156620  10/1985  United Kingdom ........... 307/277

OTHER PUBLICATIONS

IBM Technical Disclosure Bulletin, vol. 28, No. 9; Feb. 1986; pp. 3742-3744; New York, U.S.; "Pulse Generating Interface Circuit"; Armonk.
Patent Abstracts of Japan; vol. 7, No. 123 (E-178) (1268); May 27, 1983; & JP-A-58 40 928 (Hitachi Seisakusho K.K.).
IBM Technical Disclosure Bulletin; vol. 26, No. 3B, Aug. 1983; pp. 1338-1340, New York, U.S.; "Generalized Sampling Principle" by S. M. Faris.
Matz et al., IEEE Trans. on Magnetics vol. 27, No. 2, Mar. 1991 "Integrated Magnetometer with a Digital Output" pp. 2979-2982.
Gotoh et al., ISEC'91 Extended Abstract "Multichannel Single-Chip SQUID with a Josephson Multiplexer" 4 pages.
Fujimaki et al., IEEE Trans. on Electron Devices vol. 35, No. 12 1988 "A Single-Chip SQUID Magnetometer", pp. 2412-2418.
Fujimaki et al., IEEE J. Solid-State Circuits, vol. 23, No. 3, 1988 "Josephson Pseudorandom Bit-Sequence Generator" pp. 852-858.
Husao, IEICE Trans. vol. E 74, No. 2, 1991 "Josephson LSIs" pp. 578-585.

*Primary Examiner*—Gerard R. Strecker
*Attorney, Agent, or Firm*—Staas & Halsey

[57] ABSTRACT

A superconducting circuit system comprises a biasing circuit for producing a bias current that changes periodically, and a superconducting rectifier circuit driven by the bias current. The superconducting rectifier circuit is supplied with a first pulse train including therein positive and negative pulses in synchronization with the bias current and produces a second pulse train of unipolar pulses in response to a transition of a Josephson junction caused by the pulses of the first pulse train.

8 Claims, 10 Drawing Sheets

SUPERCONDUCTING CIRCUIT HAVING A RECTIFIER FOR CONVERTING A BIPOLAR SIGNAL TO A UNIPOLAR SIGNAL

BACKGROUND OF THE INVENTION

The present invention generally relates to superconducting circuits, and more particularly to a superconducting rectifier for converting bipolar logic signals produced by a Josephson circuit to unipolar logic signals.

Superconducting circuits that operate based upon the switching of the Josephson junction are studied intensively in relation to the ultra-fast logic processors and computers. On the other hand, there is an important application of the superconducting circuits in the medical and scientific field to construct magnetometers that have an ultra-high sensitivity.

Figure 1:
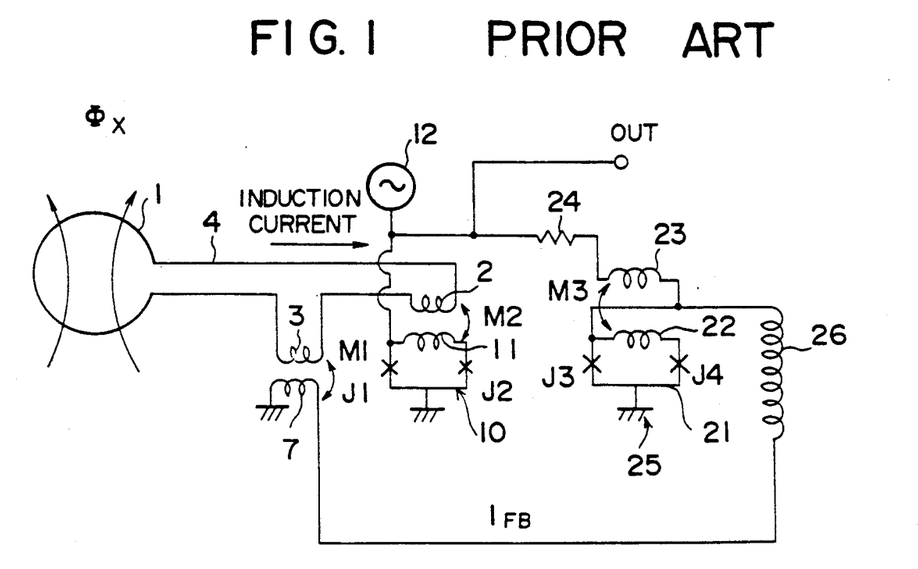
FIG. 1 is a circuit diagram showing a conventional single-chip SQUID magnetometer.

FIG. 1 shows the circuit diagram of a SQUID (superconducting quantum interference device) magnetometer proposed previously by Fujimaki et al (IEEE Transactions on Electron Devices, Vol. 35, No. 12, December 1998). The magnetometer comprises a pickup coil 1 for detecting a magnetic flux $\phi_x$, and a superconducting path 4 is connected to the pickup coil 1 such that pickup coil 1 and the superconducting path 4 form a closed superconducting loop.

Figure 2A:
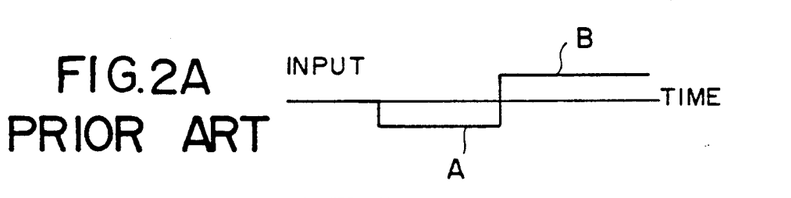
FIGS. 2(A) and 2(B) are diagrams for explaining the operation of the SQUID sensor used in the SQUID magnetometer of FIG. 1.
Figure 2B:
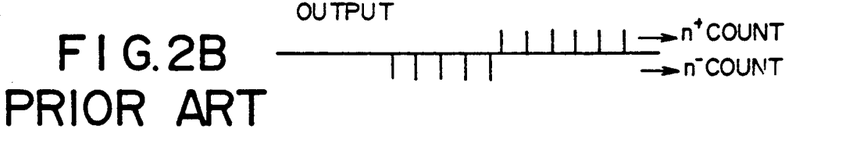

The superconducting loop 4 is coupled magnetically to another closed superconducting loop 10 that forms a SQUID sensor together with Josephson junctions J1 and J2. There, a superconducting winding 11 provided in the SQUID sensor 10 establishes a magnetic coupling M2 with a superconducting winding 2 that is formed in the loop 4, and an induction current that flows through the loop 4 in response to the interlinking of the pickup coil 1 with the unknown magnetic flux $\phi_x$ is transferred to the SQUID sensor 10. The SQUID sensor 10 is driven by a sinusoidal bias current supplied from an a.c. voltage source 12 and produces a train of output pulses with a polarity corresponding to the polarity of the unknown magnetic flux $\phi_x$ with the frequency equal to the frequency of the bias current. See FIGS. 2(A) and 2(B) wherein FIG. 2(A) shows the unknown magnetic flux $\phi_x$ schematically while FIG. 2(B) shows the output pulses produced by the SQUID sensor 10 as a result of the interlinking between the unknown magnetic flux $\phi_x$ and the pickup coil 1.

The output pulses thus produced by the SQUID sensor 10 are supplied on the one hand to an output terminal and simultaneously to a write gate 25 on the other hand via a resistor 24 and a superconducting winding 23. The write gate 25 includes a superconducting winding 22 coupled magnetically to the winding 23 as well as Josephson junctions J3 and J4, wherein the winding 22 and the Josephson junctions J3 and J4 form a closed superconducting loop. Each time the output pulse of the SQUID sensor 10 is supplied, the write gate 25 switches to a finite voltage state and stores thereby a flux quantum in a superconducting winding 26 that is connected thereto. The superconducting winding 26 in turn produces a feedback current $I_{FB}$ with an intensity proportional to the number of flux quanta stored in the winding 26 and supplies the same to a superconducting winding 7 that establishes a magnetic coupling M1 with the superconducting winding 3 of the loop 4. Thereby, the feedback current $I_{FB}$ produces a magnetic flux that counteracts the unknown flux $\phi_x$. With increasing number of magnetic quanta stored in the winding 6, the unknown flux $\phi_x$ is gradually canceled out. When canceled out entirely, the SQUID sensor 10 produces positive and negative pulses with an equal probability. By counting the number of the positive and negative pulses and calculating the difference, one can obtain the polarity as well as the strength of the unknown magnetic flux $\phi_x$.

In such a SQUID magnetometer whose output is digital, it should be noted that the output signal is obtained as a train of positive and negative pulses. In processing the output signal thus obtained, on the other hand, one generally needs a unipolar signal. Any logic circuits including Josephson circuits as well as semiconductor circuits assume the unipolar input pulses for the basis of the logic operation.

Figure 3A:
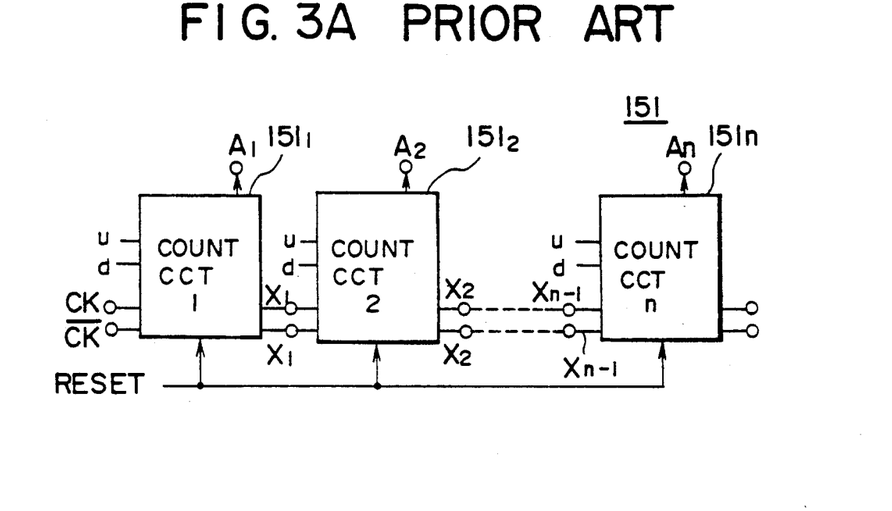
FIGS. 3(A) and 3(B) are diagrams showing the Josephson processor used for processing the output of the SQUID magnetometer of FIG. 1.

FIG. 3(A) is a block diagram of a Josephson up/down counter 151 that may be used for processing the output of the SQUID magnetometer of FIG. 1. The circuit is the one disclosed in the U.S. Pat. No. 4,947,118 which is incorporated herein as a reference. Referring to FIG. 3(A), the up/down counter 151 consists of a number of counting circuits $151_1$–$151_n$ connected in series. A first counting circuit is supplied with a clock signal CK and an inversion thereof, $\overline{CK}$, and outputs a binary data $A_1$ as the LSB (least significant bit) of the counted value. A second counting circuit, on the other hand, is supplied with a binary output data $X_1$ and an inversion thereof $\overline{X}_1$ from the first counting circuit as a carry and outputs a second binary data $A_2$ representing the second bit of the counted value, and so on. Further, each counting circuit in the up/down counter is supplied with a reset signal RESET and thereby the binary data $A_1$, ... as well as the carry $X_1$, $\overline{X}_1$, ... are reset.

Figure 3B:
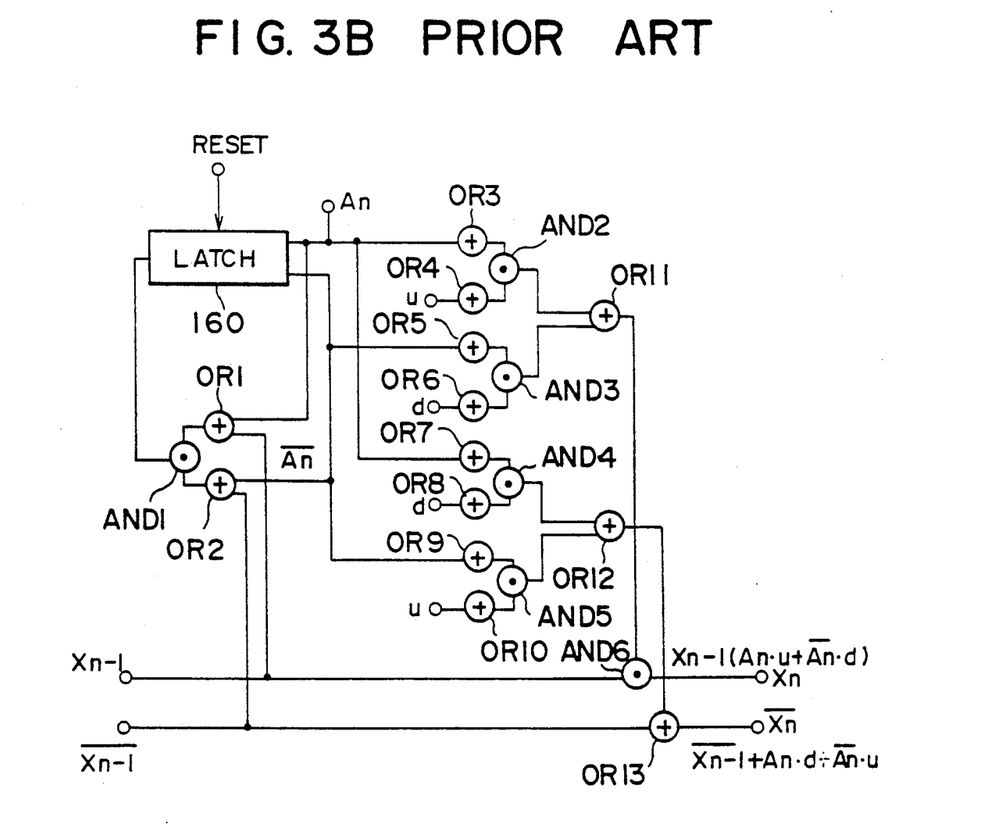

FIG. 3(B) is a circuit diagram of one of the counting circuits used in the up/down counter of FIG. 3(A). This circuit is also disclosed in the above identified reference. It will be understood that each counting circuit includes a number of AND gates represented symbolically by dots(.), and OR gates represented symbolically by plus (+). Further, there is provided a Josephson latch circuit 160 that in turn is constructed from a number of AND gates and OR gates.

Figure 4A:
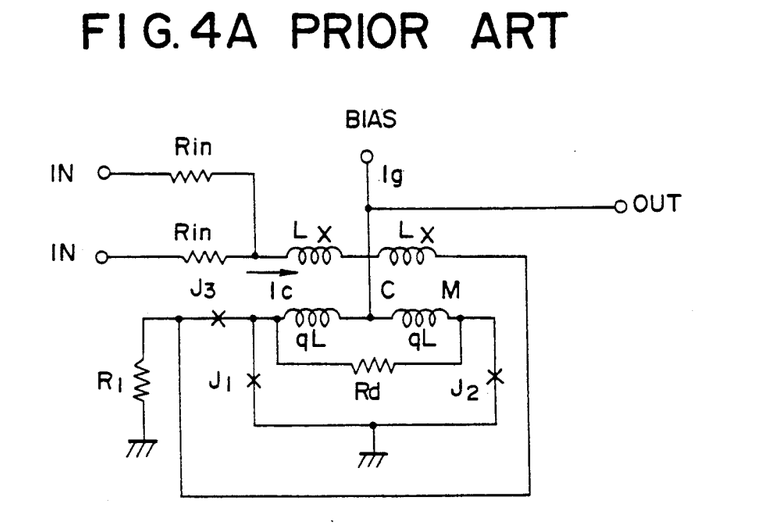
FIGS. 4(A) and 4(B) are circuit diagrams showing the fundamental Josephson logic gates used for constructing the Josephson processor of FIGS. 3(A) and 3(B)
Figure 4B:
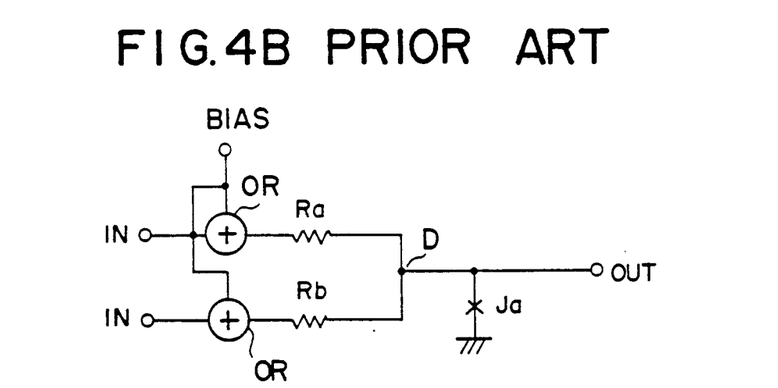

FIGS. 4(A) and 4(B) are diagrams showing the construction of the OR gate and AND gate that are used in the up/down counter described previously. These circuits are described in Fujimaki et al., "Josephson Modified Variable Threshold Logic Gates for Use in Ultra-High-Speed LSI," IEEE Transactions on Electron Devices, vol. 36, no. 2, February 1989 which is incorporated herein as reference.

Referring to FIG. 4(A), the OR gate forms an asymmetric interferometer and includes therein Josephson junctions J1 and J2. In operation, the Josephson junctions J1–J3 are all in the superconducting state in the initial state. Thereby, the bias current Ig flows to the ground directly and there appears a low or zero-output at an output terminal OUT connected to the node C. The Josephson junctions J1–J3 remain in the zero-voltage state as long as there is no input current Ic. When the current flowing through the Josephson junctions J1 and J2 has exceeded a predetermined threshold as a result of increase in the input current Ic, on the other hand, the Josephson junction J1 and J2 cause a transition to the finite-voltage state. Thereby, the bias current Ig starts to flow through the Josephson junction J3 to the ground, and in response to this, the Josephson junction J3 is turned on. As a result, a finite voltage is obtained at the output terminal. More detailed analysis of the circuit can be found in the foregoing reference by Fujimaki et al.

FIG. 4(B) shows a construction of a Josephson AND gate used in the up/down counter of FIG. 3(B). Referring to FIG. 4(B), the AND gate comprises input terminals IN connected each other at a node after coupling via the illustrated OR gates described above with respect to FIG. 4(A). A Josephson junction Ja shunts the node D to the ground. In operation, the Josephson junction Ja is designed to have a threshold current of transition such that the transition occurs only when there are input currents at both input terminals IN. Thereby, the circuit produces a logic product of the input logic signals. A more complete description of the Josephson AND gate will be found in the foregoing IEEE article by Fujimaki.

From the foregoing explanation, it will be understood that a unipolar input signal is needed to activate the AND gate or OR gate that construct the up/down counter or any other logic circuits. Thus, in order to process the output of the SQUID magnetometer of FIG. 1 by a digital circuit, it is necessary to convert the bipolar pulses of the SQUID magnetometer to unipolar pulses, and for this purpose, one needs a Josephson rectifier that is operational at the liquid helium temperature environment in cooperation with the SQUID circuits. Such a rectifier circuit is also required to be capable of processing the signals having the logic amplitude of a few millivolts or less that is typical to the Josephson devices.

SUMMARY OF THE INVENTION

Accordingly, it is a general object of the present invention to provide a novel and useful superconducting circuit, wherein the foregoing problems are eliminated.

Another and more specific object of the present invention is to provide a superconducting circuit including a superconducting conversion circuit for converting a bipolar signal to a unipolar signal.

Another object of the present invention is to provide a superconducting circuit comprising a superconducting circuit for producing a bipolar signal and a superconducting rectifier circuit that is supplied with the bipolar signal for producing a unipolar signal in response to the bipolar signal, wherein said superconducting rectifier circuit comprises either a magnetic coupling gate or a current injection gate. According to the present invention, one can obtain a unipolar output pulse suitable for digital processing even when the input bipolar signal has a small logic amplitude pertinent to the Josephson devices. In a preferred embodiment that employs the magnetic coupling gate, the input loop is formed to return the bipolar signal to a ground plane of the superconducting circuit after being coupled with the superconducting conversion circuit.

Other objects and further features of the present invention will become apparent from the following detailed description when read in conjunction with the attached drawings.

DETAILED DESCRIPTION OF THE PREFERRED EMBODIMENTS

Figure 5:
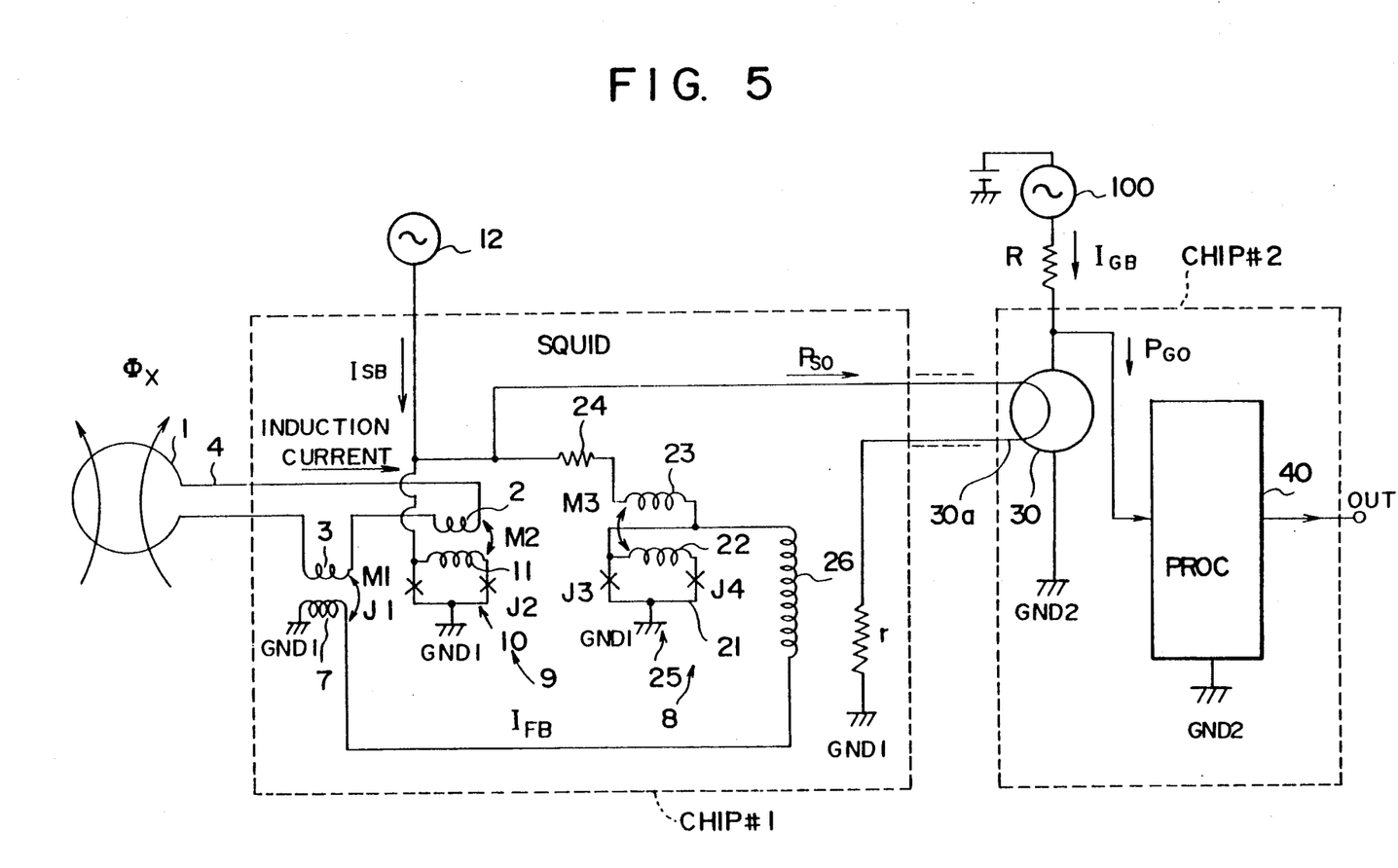
FIG. 5 is a circuit diagram showing the construction of a SQUID magnetometer according to a first embodiment of the present invention.

FIG. 5 shows the construction of the superconducting circuit according to a first embodiment of the present invention, wherein the superconducting circuit is a SQUID magnetometer for detecting a feeble or weak magnetic field $\phi_x$.

Referring to FIG. 5, the SQUID magnetometer includes a SQUID sensor substantially identical with the device explained with reference to FIG. 1. The SQUID sensor is provided on a chip #1, wherein the chip #1 is held in the liquid helium environment. The chip #1 is provided with a superconducting ground plane GND1, and various ground connections of the SQUID sensor are achieved with respect to the ground plane GND1.

In operation, a sinusoidal bias current $I_{SB}$ is supplied to the SQUID sensor on the chip #1 and the SQUID sensor operates identically with the device of FIG. 1. Thereby, bipolar output pulses are obtained similarly to the case of FIG. 2(B). It should be noted that the output pulses are produced in synchronization with the bias current $I_{SB}$. In FIG. 5, the bipolar output pulses of the SQUID sensor are designated as $P_{SO}$.

In the SQUID magnetometer of the present embodiment, the output pulses $P_{SO}$ of the SQUID sensor are sent on an output loop 30a that establishes a magnetic coupling with the magnetic coupling gate 30. The gate 30 is provided on a second chip #2 that is separated from the chip #1 and held also in the liquid helium environment. The logic gate 30 is driven by a second bias current $I_{GB}$ that is produced by an a.c. source 100 and supplied in synchronization with the bias current $I_{SB}$ but with a d.c. offset. As will be explained later in detail, the bias current $I_{GB}$ has a frequency that is twice as large as the frequency of the bias current $I_{SB}$. Thereby, the gate 30 causes a transition to the finite voltage state in response to each output pulse $P_{SO}$ as will be described below and produces unipolar output pulses $P_{GO}$ thereby. In other words, the magnetic coupling gate 30 achieves a full-wave rectification of the bipolar output pulses $P_{SO}$.

The unipolar output pulses $P_{GO}$ of the gate 30 in turn are supplied to a processing circuit 40 that may also be provided on the chip #2 for the digital processing such as counting of the number of the pulses. Any digital processing circuits may be employed for the circuit 40 as long as it can handle the logic amplitude of a few millivolts pertinent to the Josephoson devices. For example, one may use the counter described previously. Alternatively, one may provide a Josephson booster for amplifying the logic level of the output pulses $P_{GO}$ to the level that an ordinary semiconductor circuit can handle the necessary processing. An example of such a Josephson booster is described in the U.S. patent application Ser. No. 651,528, now U.S. Pat. No. 5,099,152, and in the Laid-open European Patent Application 0 441 299 A2, which are incorporated herein as reference. Further various logic circuits may be constructed for the circuit 40 for processing the output pulses $P_{GO}$, based upon the circuit elements described for example in Husao, S., IEEE Transactions vol. E74, No. 2, March 1991, or by the circuit elements described in Fujimaki et al, op cit.

In the chip #2, it should be noted that there is provided a superconducting ground plane GND2 separately from the ground plane GND1 of the chip #1. There, the magnetic coupling gate 30 as well as the processing circuit 40 have the ground connections connected to the ground plane GND2, while the loop 30a is returned to the chip #1 and connected to the ground plane GND1 of the chip #1 via a terminal resistance r, after being coupled with the gate 30. Thereby, the output loop 30a is isolated entirely from any variation of the ground current flowing through the ground plane GND2 of the chip #2 and a stabilized operation can be obtained for the gate 30.

Figure 6:
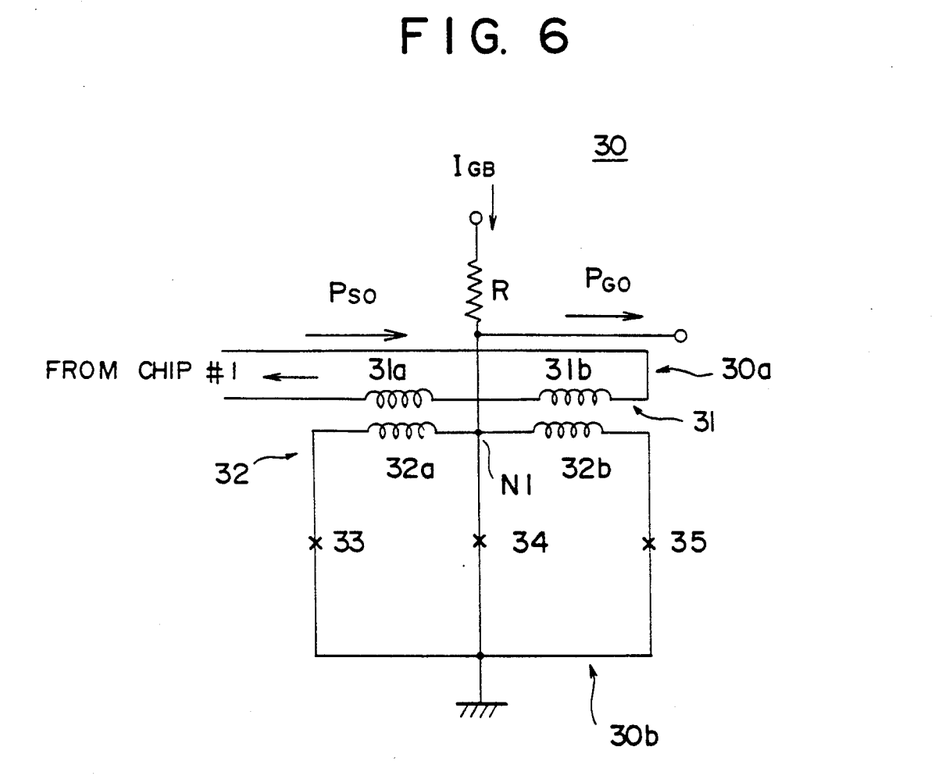
FIG. 6 is a circuit diagram showing the construction of a magnetic coupling gate.
Figure 7:
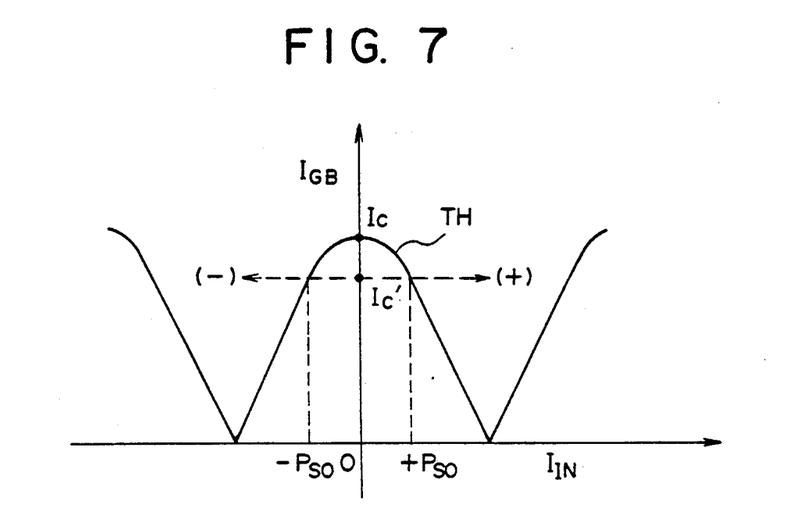
FIG. 7 is a diagram showing the operational characteristic of the magnetic coupling gate of FIG. 6.

Next, the rectification achieved by the magnetic coupling gate 30 will be described in detail with reference to FIGS. 6 and 7, wherein FIG. 6 shows the circuit diagram of the gate 30 while FIG. 7 shows the operational characteristic of the gate 30.

Referring to FIG. 6, the magnetic coupling gate 30 includes a superconducting loop 30b that is coupled magnetically to the output loop 30a. There, the loop 30b has an inductance 32 formed by a pair of windings 32a and 32b connected in series, wherein the windings 32a and 32b are coupled magnetically to corresponding winding 31a and 31b that form an inductance 31 of the loop 30a. Further, both ends of the winding 32a are shunted to the ground plane GND2 via Josephson junctions 33 and 34, while both ends of the winding 32b are shunted to the ground plane GND2 via Josephson junctions 34 and 35, as illustrated. Further, the bias current $I_{GB}$ is supplied to a node N₁ where the windings 32a and 32b are connected with each other.

Typically, the Josephson junctions 33-35 are formed of Nb electrodes that sandwich an $AlO_x$ tunneling barrier. The Josephson junctions 33-35 are characterized by the gap voltage of 2.8 mV. Thereby, the Josephson junctions 33 and 35 are formed to have a critical current of $I_1$ of 0.1 mA while the Josephson junction 34 is formed to have another critical current $I_0$ of 0.2 mA. Further, the windings 31a and 31b may have the value of 3.4 pH while the windings 32a and 32b may have the value of 3.4 pH and coupled with each other with a coupling coefficient of 0.65. It should be noted that the output pulses $P_{SO}$ have a logic amplitude of 2.8 mV.

Referring to the characteristic diagram of FIG. 7, it will be noted that the magnetic coupling gate 30 causes a transition to the finite-voltage state upon crossing of a threshold line TH. There, the bias current $I_{GB}$ is set at a level $I_{C'}$ that is slightly lower than a critical current $I_C$ at which the gate 30 causes a transition to the finite-voltage state unconditionally even when there is no input. More specifically, the level of the bias current $I_{GB}$ is set such that the input a.c. current $I_{IN}$ supplied to the line 30a with the positive or negative amplitude of the output pulses $P_{SO}$ causes the crossing of the threshold TH. When the level $I_{C'}$ is too large, on the other hand, a small input pulse such as noise may trigger the transition of the gate 30, while when the level $I_{C'}$ is too small, a large logic amplitude is needed for the output pulses $P_{SO}$ and the gate 30 may not cause the transition properly. It should be noted that the critical current $I_C$ of the gate 30 is given as a sum of the critical currents $I_1$ and $I_0$ of the Josephson junctions 33, 34 and 35 and is given as $I_C = 2I_1 + I_0$.

In the characteristic of FIG. 7, it should be noted that either of the positive and negative pulses can cause the transition of the Josephson junctions of the gate 30. In response to the transition, a positive voltage appears at the node N1 and such a positive voltage is outputted as the unipolar output pulse $P_{GO}$. In other words, the magnetic coupling gate 30 achieves a full-wave rectification of the signals having the logic level pertinent to the Josephson devices.

Figure 8A:
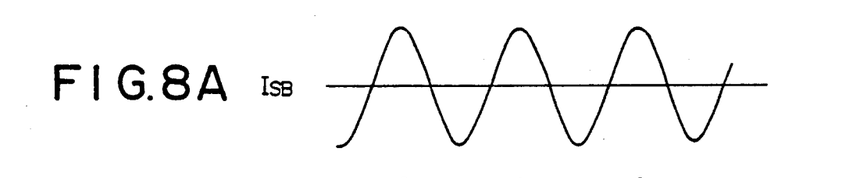
FIGS. 8(A)–8(D) are diagrams showing the waveform of various signals appearing in the circuit of FIG. 5.
Figure 8B:
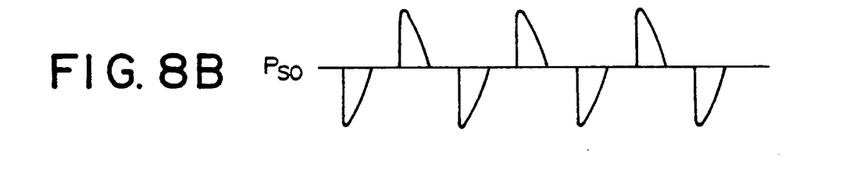

FIGS. 8(A)-8(D) show the waveform of the various signals that appear in the SQUID magnetometer of FIG. 5, wherein FIG. 8(A) shows the sinusoidal bias current $I_{SB}$. In synchronization with the sinusoidal bias current $I_{SB}$, the SQUID sensor produces the bipolar output pulses $P_{SO}$ corresponding to the output pulses of FIG. 2(B) as shown in FIG. 8(B). It should be noted that the output pulses $P_{SO}$ appear in correspondence to the positive and negative peaks of the bias current $I_{SB}$.

Figure 8C:
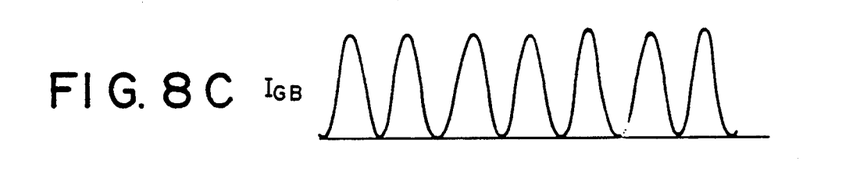

On the other hand, the bias current $I_{GB}$ has a frequency set twice as large as the frequency of the bias current $I_{SB}$ and supplied in synchronization therewith but with a d.c. offset as already described. Thereby, the peak of the bias current $I_{GB}$ corresponds to the positive and negative peaks of the bias current $I_{SB}$. As shown in FIG. 8(C), the d.c. offset applied to the bias current $I_{GB}$ is set such that the bias current remains positive. It is alternatively possible that a lower d.c. offset will cause the bias current to substantially remain positive except for every valley of the waveform. Further, the amplitude of the bias current $I_{GB}$ is adjusted to the aforementioned level $I_{C'}$ for causing the transistion of the Josephson junctions as already described. It should be noted that the magnetic coupling gate 30 is reset in response to each valley of the bias current $I_{GB}$.

Figure 8D:
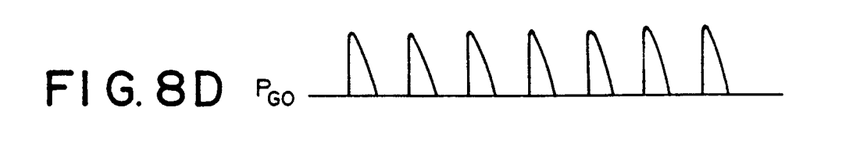

When the magnetic coupling gate 30 is biased by the bias current $I_{GB}$ as set forth above, the transition of the Josephson junctions 33 and 34 occurs in response to each pulse in the pulse train $P_{SO}$. It should be noted that each positive or negative pulse of the pulse train $P_{SO}$ is supplied substantially in synchronization with the peak of the bias current $I_{GB}$ and causes the transition of the Josephson junctions. See FIG. 7. In response to each transition, there appears a positive voltage at the output of the gate 30 and the pulse train shown in FIG. 8(D) is obtained as the pulses $P_{GO}$. It will be understood that the input pulses $P_{SO}$ are thereby subjected to a full-wave rectification.

In the first embodiment of the present invention described heretofore, the circuit of the first embodiment operates stably, as the output pulses $P_{SO}$ are returned to the ground plane GND1 of the chip #1 after being coupled with the magnetic coupling gate 30. Thereby, the output pulses $P_{SO}$ that trigger the transition of the Josephson junctions 33 and 34 of the gate 30 are held immune to the ground current flowing through the ground plane GND2 of the chip #2.

On the other hand, the circuit of the first embodiment has a problem in that it cannot discriminate the polarity of the input pulses $P_{SO}$, as the circuit 30 produces the output pulse $P_{GO}$ regardless of the polarity of the input pulses $P_{SO}$. Depending on the type of the digital processing applied to the output signal $P_{GO}$, this may cause a problem.

Next, a second embodiment of the present invention wherein the foregoing problem is eliminated, will be described with reference to FIG. 9.

Figure 9:
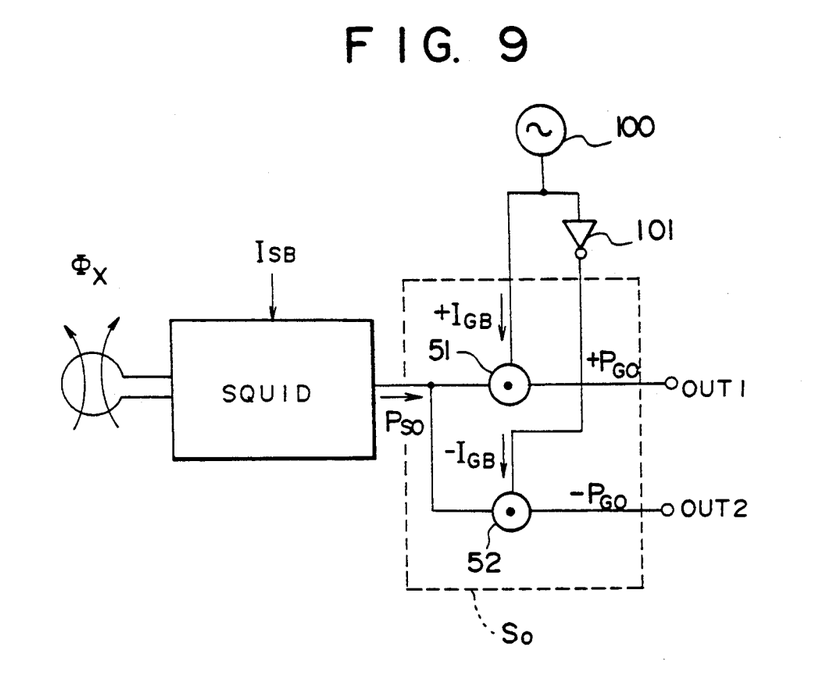
FIG. 9 is a diagram showing the construction of a SQUID magnetometer according to a second embodiment of the present invention.

Referring to FIG. 9, the present embodiment is also a SQUID magnetometer and includes a SQUID sensor that produces the output pulses $P_{SO}$ in response to the bias current $I_{SB}$. There, the output pulses $P_{SO}$ are supplied on the one hand to a first current injection gate 51 that is biased by the bias current $I_{GB}$ and on the other hand to a second current injection gate 52. Here, the gate 52 is driven by a bias current $-I_{GB}$ that is an inversion of the bias current $I_{GB}$ with respect to the polarity. The current $-I_{GB}$ may be formed by an inverter 101.

Figure 10:
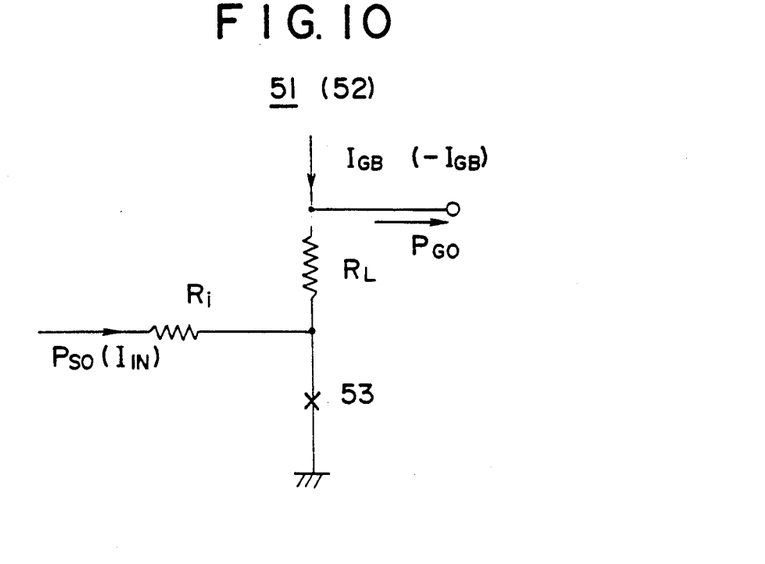
FIG. 10 is a current injection gate used in the SQUID magnetometer of FIG. 9.

FIG. 10 shows the construction of the current injection gate 51. Referring to FIG. 10, the gate 51 includes a single Josephson junction 53 that is biased by the bias current $I_{GB}$ via a resistance $R_L$. Further, the pulses $P_{SO}$ are supplied to the Josephson junction 53 via a resistance $R_i$ as an input current $I_{IN}$ and triggers the transition of the Josephson junction together with the bias current $I_{GB}$. The current injection gate 52 has a substantially identical construction with the gate 51 except that the bias current $-I_{GB}$ is supplied instead of the bias current $I_{GB}$.

Figure 11:
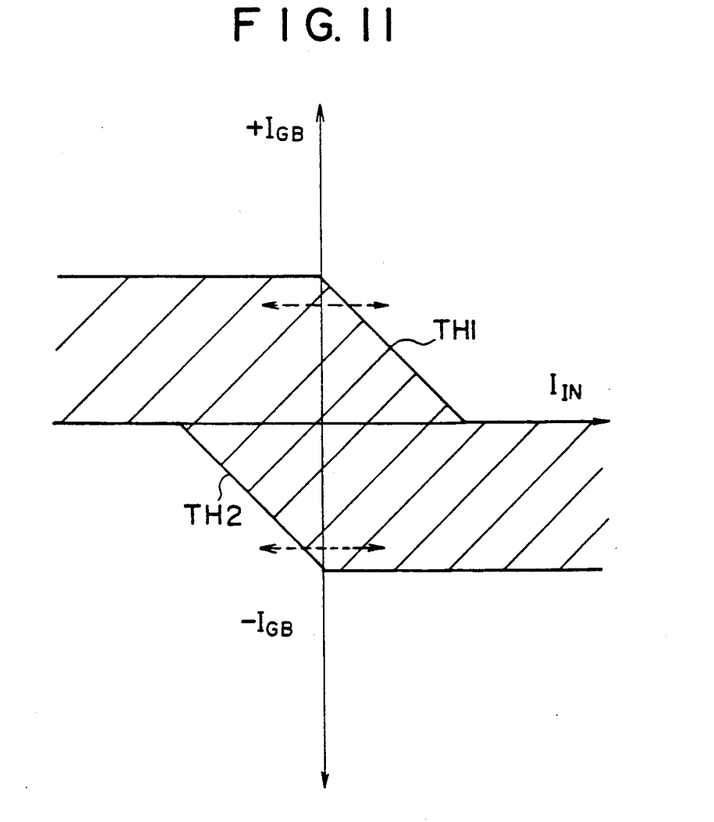
FIG. 11 is a diagram showing the operational characteristic of the current injection gate of FIG. 10.

FIG. 11 shows the operational characteristic of the current injection gate 51.

Referring to FIG. 11, the zero-voltage region of the Josephson junction 53 is defined by a pair of generally parallel threshold lines extending horizontally, wherein the threshold lines include parts $TH_1$ and $TH_2$ that extend obliquely to the vertical axis representing the bias current $I_{GB}$. The gate 51 thereby shows the zero-voltage state in correspondence to the region represented in FIG. 11 by hatching.

There, the gate 51 is biased by the positive bias current $I_{GB}$, and the operational point crosses the threshold line $TH_1$ in response to the positive voltage pulse $P_{SO}$ that is supplied as an input current $I_{IN}$. In response to the crossing of the threshold $TH1$, the transition of the Josephson junction 53 occurs and a positive output pulse is produced as an output pulse $P_{GO}$. On the other hand, when a negative voltage pulse $P_{SO}$ is supplied during the same state in which the gate 51 is biased by the positive bias current $I_{GB}$, the crossing of the threshold line $TH2$ does not occur. In other words, the gate 51 does not produce a negative output pulse $P_{GO}$ even when a negative input pulse $P_{SO}$ is supplied, as long as the gate is biased by the positive bias current $I_{GB}$.

In the case of the gate 52, on the other hand, the gate is biased by the negative bias current $-I_{GB}$. There, the transition of the Josephson junction 53 occurs only when a negative voltage pulse $P_{SO}$ is supplied, and the gate 52 produces a negative output pulse $-P_{GO}$ in response to the transition. The transition does not occur when a positive pulse is supplied as the pulse $P_{SO}$.

Summarizing the above, the current injection gate 51, biased by the positive bias current $+I_{GB}$, produces a positive output pulse $P_{GO}$ in response to each positive input pulse $P_{SO}$, while there is no output pulse produced when a negative pulse is supplied as the pulse $P_{SO}$. On the other hand, the current injection gate 52 is biased by the negative bias current $-I_{GB}$ and produces the negative output pulse $P_{GO}$ only when a negative input pulse is supplied as the pulse $P_{SO}$. In order to assure the foregoing operation, the resistances $R_i$ and $R_L$ of the gate 51 are set such that the crossing of the threshold line $TH_1$ occurs with reliability in response to the positive voltage pulse $P_{SO}$ when the positive bias current $I_{GB}$ is supplied and such that the crossing of the threshold line $TH_2$ never occurs in the same biasing condition. Similarly, the resistances $R_i$ and $R_L$ of the gate 52 are set such that the crossing of the threshold line $TH_2$ occurs with reliability in response to the negative voltage pulse $P_{SO}$ when the negative bias current $-I_{GB}$ is supplied and such that the crossing of the threshold line $TH_2$ never occurs in the same biasing condition. Typically, the values of the resistances $R_i$ and $R_L$ are set to 60 Ω respectively.

It should be noted that one can use the gate shown in FIG. 4(A) for the gate 51 or 52. In this case, the gate shows an increased sensitivity against the input voltage signal because of the simultaneous use of the magnetic coupling and the current injection.

Figure 12A:
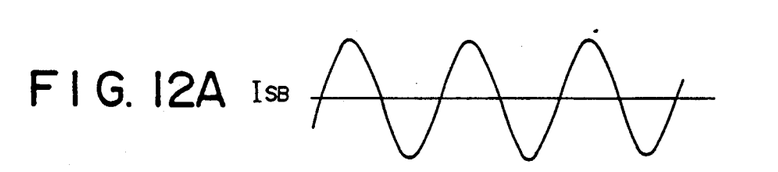
FIGS. 12(A)–12(E) are diagrams showing the waveform of various signals appearing in the circuit of FIG. 9.
Figure 12B:
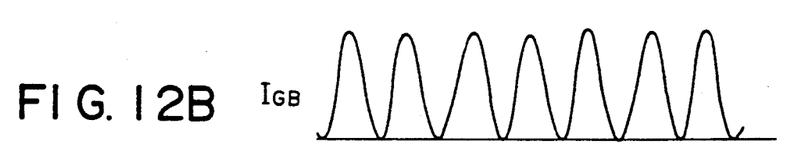
Figure 12C:
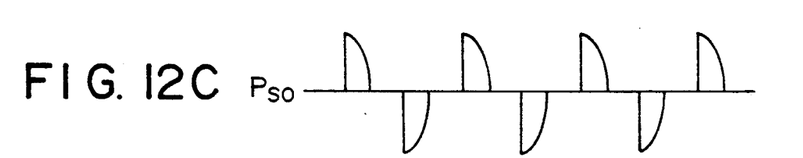
Figure 12D:
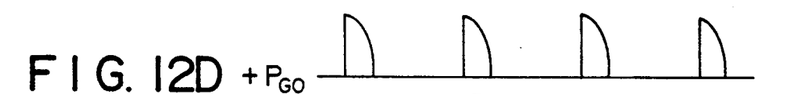
Figure 12E:
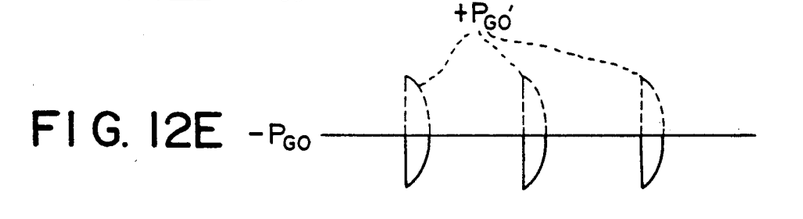

FIGS. 12(A)–12(E) show the phase relationship of various waveforms that appear in the circuit of FIG. 9, wherein FIG. 12(A) shows the bias current $I_{SB}$ and FIG. 12(B) shows the bias current $I_{GB}$. Similarly to the first embodiment, the output pulses $P_{SO}$ are produced by the SQUID sensor in response to and in synchronization with the bias current $I_{SB}$ as shown in FIG. 12(C). On the other hand, the current injection gate 51 produces the positive pulses $+P_{GO}$ in response to the positive pulse $P_{GO}$ and in response to the peak of the bias current $I_{GB}$ as shown in FIG. 12(D). Further, the current injection gate 52 produces the negative pulses $-P_{GO}$ in response to the negative pulses $-P_{SO}$ and further in response to the negative peak of the bias current $-I_{GB}$ as shown in FIG. 12(E).

According to the present embodiment, one can discriminate the polarity of the input pulses $P_{SO}$ simultaneously to the rectification. In the circuit of FIG. 9, the positive output pulses $P_{GO}$ are obtained at an output port $OUT_1$ connected to the gate 51, while the negative output pulses $-P_{GO}$ are obtained at another output port $OUT_2$ connected to the gate 52.

Figure 13:
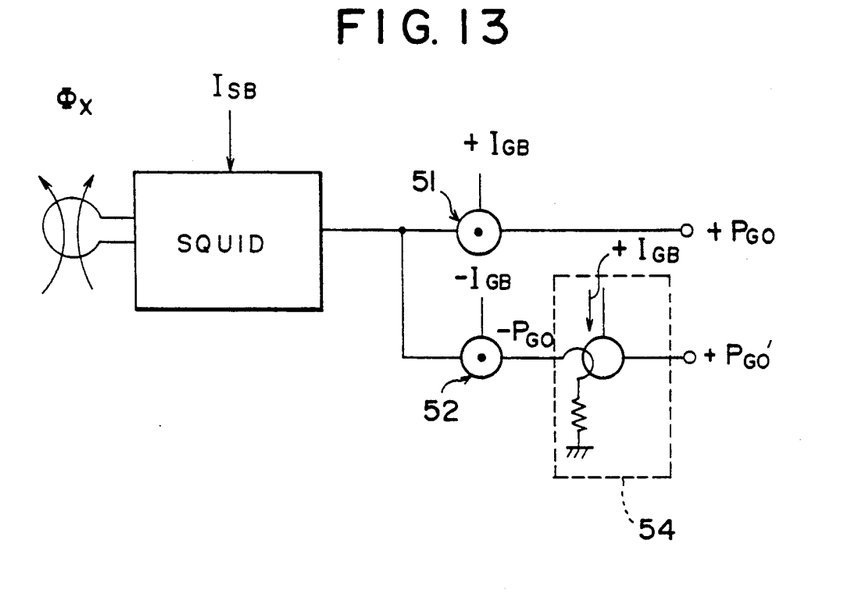
FIG. 13 is a diagram showing the construction of a SQUID magnetometer according to a third embodiment of the present invention.

Next, a third embodiment of the present invention corresponding to a modification of the second embodiment will be described with reference to FIG. 13. In this embodiment, a magnetic coupling gate 54 similar to the gate 30 of the first embodiment is connected to the current injection gate 52 for inverting the polarity of the negative output pulses $-P_{GO}$. There, the gate 54 is driven in synchronization with the gate 51 in response to the bias current $I_{GB}$, and positive output pulses $P_{GO}'$ are produced in response to the negative output pulses $-P_{GO}$ of the gate 52 as shown by the broken line in FIG. 12(E). As the operation of this embodiment is apparent from the foregoing descriptions, further description thereof will be omitted.

Further, the present invention is not limited to the embodiments described heretofore, but various variations and modifications may be made without departing from the scope of the invention.

What is claimed is:

1. A superconducting circuit system, comprising:
   biasing means for producing a bias current that changes periodically; and
   a superconducting rectifier circuit, having a Josephson junction gate connected between said biasing means and a ground plane, the Josephson junction gate operatively connected to receive at an input thereof a first pulse train including therein positive and negative pulses in synchronization with the bias current,
   a Josephson junction, biased by said bias current, included in said Josephson junction gate, causing a transition from a superconducting state to a finite voltage state in response to the pulses of the first pulse train,
   said superconducting rectifier circuit rectifying the pulses of the first pulse train to produce at an output of said Josephson junction gate a second pulse train of unipolar pulses in response to the transition of the Josephson junction.

2. A superconducting circuit system as claimed in claim 1 in which said biasing means produces said bias current as an a.c. current having a d.c. offset and a frequency corresponding to a rate of repetition of the pulses in the first pulse train.

3. A superconducting circuit system as claimed in claim 2 in which said biasing means produces the bias current substantially as a unipolar current with a magnitude set such that the pulses of the first pulse train cause the transition of the Josephson junction.

4. A superconducting circuit system as claimed in claim 1, wherein the Josephson junction gate is magnetically coupled to the first pulse train.

5. A superconducting circuit system as claimed in claim 1, wherein a current of the first pulse train is injected into the Josephson junction.

6. A superconducting circuit system, comprising:
   biasing means for producing a bias current that changes periodically, said biasing means produces a first bias current as an a.c. current with a positive d.c. offset and a second bias current as a polarity-inversion of the first bias current; and
   a superconducting rectifier circuit, connected to said biasing means, having a first Josephson junction gate driven by said first bias current and a second Josephson junction gate driven by said second bias current, said first Josephson junction gate operatively connected to receive a first pulse train for rectifying the pulses of the first pulse train to produce positive polarity pulses as a second pulse train in response to each positive polarity pulse in the first pulse train, said second Josephson junction gate operatively connected to receive the first pulse train for rectifying the pulses of the first pulse train to produce negative polarity pulses as the second pulse train in response to each negative polarity pulse in the first pulse train.

7. A superconducting circuit system comprising:
   first biasing means for producing a first bias current having a first frequency;
   a superconducting circuit driven by said first bias current for producing a first pulse train including therein positive and negative pulses having a pulse frequency coincident with the first frequency;
   second biasing means for producing a second bias current having a second frequency that is set twice as large as the first frequency; and
   a superconducting rectifier circuit having a Josephson junction gate driven by said second bias current, said Josephson junction gate operatively connected to receive the first pulse train, a Josephson junction included in said Josephson junction gate causing a transition from a superconducting state to a finite voltage state in response to the pulses of the first pulse train,
   said superconducting rectifier circuit rectifying the pulses of the first pulse train to produce a second pulse train of unipolar pulses in response to the transition of said Josephson junction.

8. A superconducting circuit system as claimed in claim 7, wherein said first superconducting circuit and said superconducting rectifier circuit are provided on first and second circuit chips that are separated from each other, said first chip and said second chip having first and second ground planes respectively, said superconducting circuit supplies the first pulse train on an output line that is coupled magnetically to said Josephson gate of said superconducting rectifier circuit, said output line being connected to said first ground plane after being coupled to said Josephson junction gate.

* * * * *